United States Patent
Wong et al.

(10) Patent No.: US 6,972,588 B1
(45) Date of Patent: *Dec. 6, 2005

(54) ADJUSTABLE DIFFERENTIAL INPUT AND OUTPUT DRIVERS

(75) Inventors: Wilson Wong, San Francisco, CA (US); Sergey Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/029,275

(22) Filed: Jan. 5, 2005

Related U.S. Application Data

(63) Continuation of application No. 10/669,298, filed on Sep. 24, 2003, now Pat. No. 6,864,704.

(51) Int. Cl.[7] ............................................. H03K 17/16
(52) U.S. Cl. ............................................. 326/26; 326/82
(58) Field of Search ...................... 326/26, 27, 37–41, 326/82, 83

(56) References Cited

U.S. PATENT DOCUMENTS

| | | |
|---|---|---|
| 6,236,231 B1 | 5/2001 | Nguyen et al. |
| 6,362,644 B1 | 3/2002 | Jeffery et al. |
| 6,437,599 B1 | 8/2002 | Groen |
| 6,448,815 B1 | 9/2002 | Talbot et al. |
| 6,515,508 B1 | 2/2003 | Chang et al. |
| 6,531,892 B2 | 3/2003 | Ghia et al. |
| 6,590,422 B1 | 7/2003 | Dillon |
| 6,603,329 B1 | 8/2003 | Wang et al. |
| 2002/0170011 A1 | 11/2002 | Lai et al. |
| 2004/0123197 A1 | 6/2004 | Sunter et al. |

*Primary Examiner*—Don Le
(74) *Attorney, Agent, or Firm*—G. Victor Treyz

(57) ABSTRACT

Systems and methods are provided using common-mode-voltage bias circuitry to make common-mode-voltage adjustments to differential driver circuitry in integrated circuit differential communications links. Adjustable bias circuitry may be controlled using static and dynamic control signals. Dynamic control signals can be produced by core logic on a programmable logic device or other integrated circuit. Static control signals can be produced by programmable elements. Bias circuit adjustments made at one end of a differential link can be used to improve performance at either end of the link or can be used to improve power consumption or to balance power and performance considerations. The same integrated circuit design can be used in both AC-coupled and DC-coupled environments. The bias circuitry can be formed from an adjustable current source and adjustable resistor. The current source and adjustable resistors can be controlled by the same control signals.

20 Claims, 13 Drawing Sheets

| | $R_{CMRX}$ | $I_{BIAS-RX}$ | $R_{CMTX}$ | $I_{BIAS-TX}$ | $I_{CONTENTION}$ | $V_{CM-RX-INT}$ | $V_{CM-TX-INT}$ | $V_{CM-RX}$ |
|---|---|---|---|---|---|---|---|---|
| ADJUST $R_{CMRX}$ ↓ TO MAKE $V_{CM-RX}$ CLOSER TO DESIRED LEVEL | ↓ | ↑ | — | — | ↑ | ↑ | ↑ | ↑ (CLOSER TO OPTIMUM CM VOLTAGE AT RX) |
| ADJUST $R_{CMTX}$ ↑ TO MAKE $V_{CM-RX}$ CLOSER TO DESIRED LEVEL | — | — | ↑ | ↓ | ↓ | ↑ | ↑ | ↑ (CLOSER TO OPTIMUM CM VOLTAGE AT RX) |

FIG. 15

ADJUSTABLE DIFFERENTIAL INPUT AND OUTPUT DRIVERS

This application is a continuation of patent application Ser. No. 10/669,298, filed Sep. 24, 2003 U.S. Pat. No. 6,864,704, which is hereby incorporated by reference herein in its entirety.

BACKGROUND OF THE INVENTION

This invention relates to integrated circuit input-output (I/O) circuitry, and more particularly, to adjustable differential integrated circuit input and output drivers for AC-coupled and DC-coupled communications links.

Input-output (I/O) circuitry is used on integrated circuits as an interface between the circuitry on the integrated circuit and external components. Input-output circuitry typically includes either single-ended or differential input drivers and single-ended or differential output drivers.

Single-ended drivers are used to handle single-ended signa—i.e., signals that are referenced to ground.

Differential drivers are used to handle differential signals, which are carried on pairs of conductors. Differential signals are referenced to each other, rather than a source of ground potential. One of the differential signals in each differential signal pair may be labeled "positive" and the other one of the differential signals in that pair may be labeled "negative."

The average voltage of a differential signal is called its "common mode" voltage ($V_{CM}$). To ensure proper operation of the differential input and output drivers in a high-speed link, the voltage swing of each of the differential signals (i.e., the voltage difference between the maximum and minimum of a differential signal) and the common-mode voltage of each signal should remain within certain prescribed ranges. Common-mode voltage bias circuitry is used to bias the drivers so that the differential signals remain within these ranges.

Differential communications links between integrated circuits may be AC-coupled or DC-coupled. The conductors in a DC-coupled communications link pass directly between an output driver on one circuit and a corresponding input driver on another circuit. In AC-coupled communications links, DC-blocking capacitors are used to block DC signals between the circuits, while allowing high-speed data signals to pass without interruption.

An advantage of AC-coupling in a link between two integrated circuits is that the capacitors effectively decouple the common-mode voltage level requirements of the output drivers of the first circuit from the common-mode voltage requirements of the input drivers of the second circuit. Each circuit can be biased as needed to ensure that the differential signal voltages remain within suitable limits. The DC-blocking capacitors also decouple the ground voltages of the two integrated circuits, which might not always be at the same level.

With a DC-coupled arrangement, only a single common-mode bias circuit is needed for each link and the DC-blocking capacitors are not required. Due to such considerations, DC-coupled arrangements are sometimes preferred by system designers.

With conventional DC-coupled arrangements, only a single common-mode bias circuit is typically used for each link. If bias circuits are used at both the output driver and the input driver of a link, these bias circuits can contend with each other. This may lead to undesirable power losses. Moreover, when the common-mode biases from each end of a link do not match, the common-mode voltage for the input and output drivers may settle to a level that is not optimal.

Conventional integrated circuits therefore generally contain differential I/O circuitry that is designed to support either AC-coupled communications or DC-coupled communications. If a system designer desires to use a DC-coupled link in a particular system, an integrated circuit with I/O circuitry designed for DC-coupled communications is used.

It would be desirable to be able to provide greater flexibility to system designers and to improve performance in high-speed differential signaling communications links.

SUMMARY OF THE INVENTION

In accordance with the present invention, adjustable differential input and output driver circuitry is provided. Output drivers on one integrated circuit may be used to transmit data to input drivers on another integrated circuit over AC-coupled or DC-coupled differential communications lines.

Differential signals on each communications path may be characterized by a common-mode voltage $V_{CM}$ and a maximum peak-to-peak voltage swing. The input and output drivers may be provided with common-mode-voltage bias circuitry that can be adjusted to ensure that the differential signals remain within suitable limits.

A given circuit can be configured to support either AC-coupled or DC-coupled operation, thereby giving system designers greater flexibility. In DC-coupled environments, contention between transmitters and receivers can be reduced by using the bias circuitry to make bias signal adjustments on either the transmitter side or the receiver side of a link. In AC-coupled environments, the bias circuitry can be used on each end of a link to improve driver performance without regard to potential common-mode-voltage-induced performance degradation at the other end of the link.

Common-mode-voltage bias circuitry can be provided with adjustable resistor and current source (or voltage source) circuitry. This adjustable circuitry can be controlled using static and/or dynamic control signals. The adjustable resistor and current or voltage source circuitry can be adjusted to minimize power loss due to contention current, to maximize performance, or to balance power loss and performance considerations.

The adjustable driver bias circuits and corresponding input and output circuitry may be implemented on programmable logic devices. Static control signals can be provided at the outputs of random-access-memory cells or other programmable elements on a programmable logic device. Dynamic control signals can be provided by dynamic control circuitry that is implemented in the programmable logic on the device or from an external source. The static and dynamic control signals can be used to adjust the bias circuitry. For example, the static and dynamic control signals can be used to turn on and off corresponding control transistors in the bias circuitry.

Bias circuits based on adjustable resistors and current sources may use independently-adjustable arrangements in which the resistance produced by the adjustable resistor can be controlled separately from the current level produced by the adjustable current source or may use integral arrangements in which the operation of the adjustable resistor and current source are coupled and controlled by the same control signals.

With one suitable independently-adjustable resistor arrangement, an adjustable resistor may be formed using multiple parallel fixed-value resistors which are selectively switched into use by turning on or off appropriate gating transistors. The greater the number of resistors that are electrically connected in parallel, the lower the overall resistance of the adjustable resistor that results. An independently-adjustable current source may use a current mirror arrangement in which each branch of a multi-section current mirror has an associated control transistor. By turning on or off a desired number of control transistors, the current from the current mirror branch sections can be selectively combined with or subtracted from the overall current being produced.

In a suitable combined resistor-current-source arrangement, the current source may be implemented as multiple current mirror branch sections, each having an associated series-connected resistor. Control transistors can be used to connect or disconnect desired branches from the circuit. When more branches are connected, the current contributions from those branches increase the overall current source current, while the additional parallel resistance contribution from those branches decreases the overall resistance of the circuit.

A programmable logic device or other integrated circuit containing the adjustable driver circuitry can communicate with multiple integrated circuits on a multi-drop bus. A single integrated circuit can use both adjustable input drivers and adjustable output drivers so that the performance and power consumption of differential signals paths associated with these drivers can be optimized.

Further features of the invention, its nature and various advantages will be more apparent from the accompanying drawings and the following detailed description of the preferred embodiments.

BRIEF DESCRIPTION OF THE DRAWINGS

FIG. 15 is a table showing how adjustments in common-mode voltage and bias circuit resistance affect link performance in accordance with the present invention.

DETAILED DESCRIPTION OF THE PREFERRED EMBODIMENTS

The present invention relates to adjustable differential input and output drivers. The invention also relates to the integrated-circuits and systems with which such differential input and output drivers are used and methods for controlling and using these components.

Figure 1:
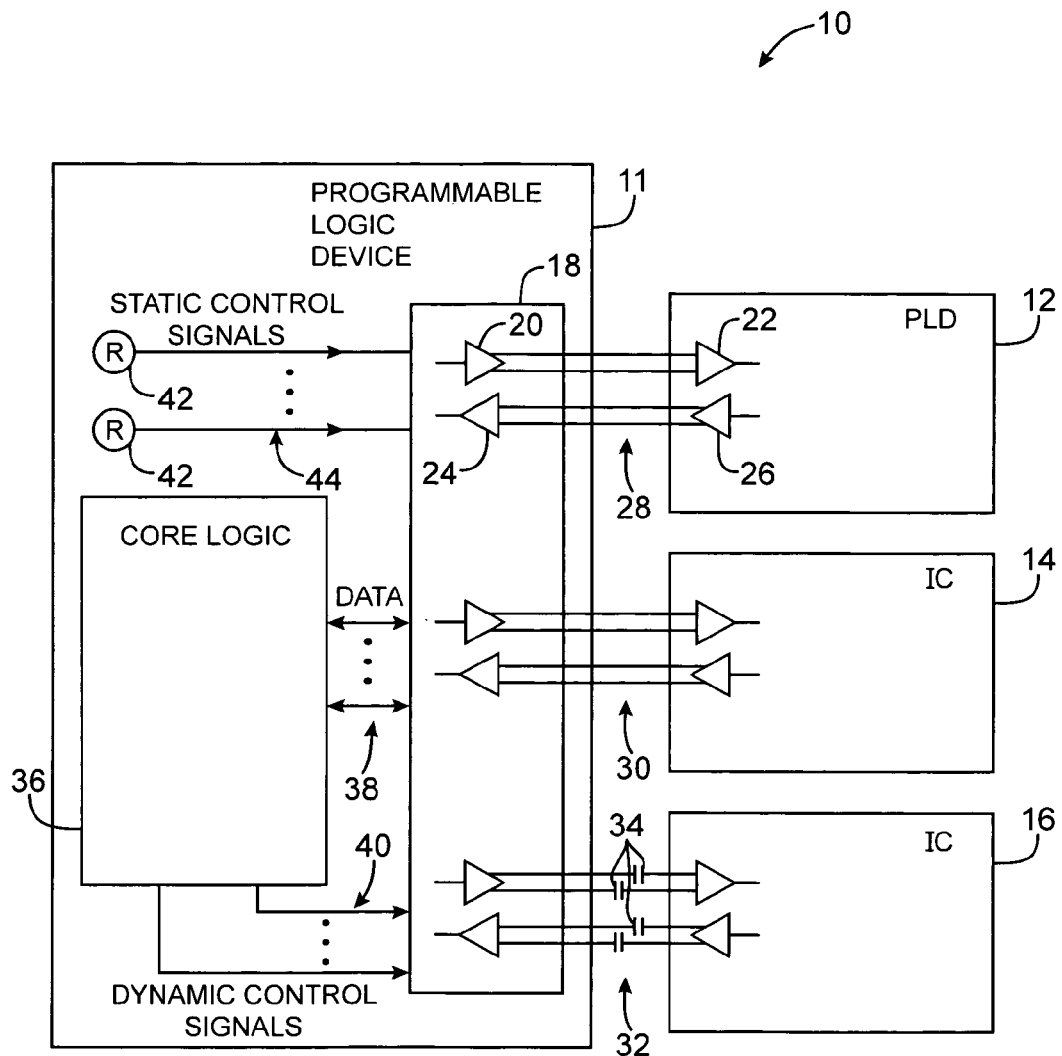
FIG. 1 is a schematic diagram of an illustrative system using high-speed differential communications paths to support communications between a programmable logic device and other devices including another programmable logic device and two other integrated circuits in accordance with the present invention.

An illustrative system 10 in accordance with the present invention is shown in FIG. 1. In the illustrative system of FIG. 1, a programmable logic device integrated circuit 11 is in communication with another programmable logic device 12 and integrated circuits 14 and 16. Some of the communications in system 10 such as communications between programmable logic device 11 and other integrated circuit components may be made using single-ended input and output drivers. With single-ended input and output drivers, data signals are referenced to ground potential.

In the example of FIG. 1, the communications links between the components of the system are differential communications links. In each differential signal path, the signals are referenced to each other, rather than to ground.

Programmable logic device 11 may have input/output circuitry 18 for driving signals off of device 11 and for receiving signals from other devices. Input/output circuitry 18 may contain differential output drivers such as differential output driver 20. The signals from such differential output drivers may be received by corresponding differential input drivers such as differential input driver 22 of programmable logic device 12.

The high-speed differential signal paths depicted in FIG. 1 are unidirectional. Bi-directional communications between devices in system 10 may be supported using a differential signal path that conveys signals in the opposite direction. For example, data may be conveyed to programmable logic device 11 from programmable logic device 12 by transmitting the data using differential output driver 26 on programmable logic device 12 and by receiving these differential signals on a corresponding input driver 24 on programmable logic device 11.

Although only a single set of two differential communications paths are shown as connecting programmable logic device 11 and programmable logic device 12, in general any suitable number of such differential communications paths may be used. Only two such paths are shown between devices 11 and 12 in FIG. 1 to avoid over-complicating the drawing.

As shown in FIG. 1, the input/output circuitry of programmable logic device 11 may also be used to support differential communications with other integrated circuits such as integrated circuit 14 and integrated circuit 16. Communications between programmable logic device 11 and programmable logic device 12 involve the use of differential communications paths 28. Differential communications paths 30 are used for communications between programmable logic device 11 and integrated circuit 14.

Paths 28 and 30 are DC-coupled communications paths. If desired, communications may also be supported using AC-coupled differential communications paths such as paths 32 between programmable logic device 11 and integrated circuit 16. AC-coupled paths such as paths 32 may have DC-blocking capacitors such as capacitors 34. The DC-blocking capacitors help to isolate programmable logic device 11 from external components such as integrated circuit 16.

The programmable logic device input-output circuitry 18 may be supplied with data from core logic 36 on the programmable logic device using one or more data paths 38. Data paths 38 may also be used to convey data received by the input-output circuitry 18 to the core logic. Core logic 36 may include user-programmable logic and hard-wired circuitry.

The input-output circuitry 18 may be controlled by control signals from within the programmable logic device (or external control signals routed through the input-output pins on the device). Dynamic control signals may be received from an external source or may be generated in real time by dynamic control circuitry within core logic 36. Dynamic control signals may be applied to input-output circuitry 18 using control lines such as control lines 40. Static control signals may be provided to input-output circuitry 18 from programmable elements 42 over static control lines such as lines 44.

The programmable elements or bits 42 of programmable logic device 11 may used to produce static control signals for lines 44 and may be used in core logic 36 to configure the logic in core logic 36 so that programmable logic device 11 performs custom logic functions desired by a user.

The programmable elements 42 that are used for device 11 may be implemented using any suitable technology. For example, the programmable logic devices may be based on one-time programmable devices such as fuses or antifuses. The programmable logic devices may be based on electrically-programmable read-only-memory (EPROM) or erasable-electrically-programmable read-only-memory (EEPROM) technology. If desired, programmable logic device 11 may use random-access memory (RAM) cells for its programmable elements.

With electrically-programmable technology, programmable elements (e.g., the RAM cells) may be configured using configuration data that is provided from an external memory device. For example, when the system is powered-up or at another appropriate time, configuration data from the external memory device may be transferred from the external memory device into the programmable logic device to configure RAM cells in the programmable logic device. Each of the RAM cells may control a transistor or other element on the programmable logic device, so by configuring the RAM cells, one can selectively turn on and off portions of the circuitry in the programmable logic device and thereby customize its functions as needed.

Regardless of the particular type of programmable-technology used for programmable logic device 11, programmable logic device 11 may be customized so that its core logic 36 can perform customized logic functions. Other circuitry in core 36 (e.g., memory and dedicated logic) may also be used and the capabilities of such circuitry may be combined with the custom logic functions implemented by a user in the programmable logic.

The functions implemented by core logic 36 may be used to control the operation of device 11 (e.g., via dynamic control signals 40) and may be used to generate data for data signal lines 38. Static control signals from programmable elements 42 may be used with the dynamic control signals on paths 40 or instead of such dynamic control signals to control input-output circuitry 18 and other portions of programmable logic device 11.

The input and output drivers shown in input-output circuitry 18 of FIG. 1 may be single-ended or differential drivers. Sometimes input and output drivers may be referred to as input and output buffers or as receivers and transmitters. In general, such terminology may be used interchangeably.

Device 11 may support communications over a number of different communications links such as the differential communications links of FIG. 1. To accommodate the diverse requirements of different links (e.g., AC-coupled and DC-coupled links, links using different signaling standards, links over lines of different impedances, etc.), the input-output circuitry 18, and in particular, the input and output drivers in circuitry 18 may be adjusted using static and/or dynamic control signals. Although described in the context of a programmable logic device, this adjustable functionality for the input-output circuitry of device 11 may, if desired, be implemented in other types of integrated circuits, such as memory devices, application specific integrated circuits, digital signal processors, microprocessors, analog circuits, digital circuits, communications chips, etc. Such circuits may, for example, be constructed to contain the input and output driver circuitry of the present invention in combination with the other circuitry used for performing their desired functions (e.g., DSP circuitry on a digital signal processor, microprocessor circuitry on a microprocessor, etc.).

Figure 2:
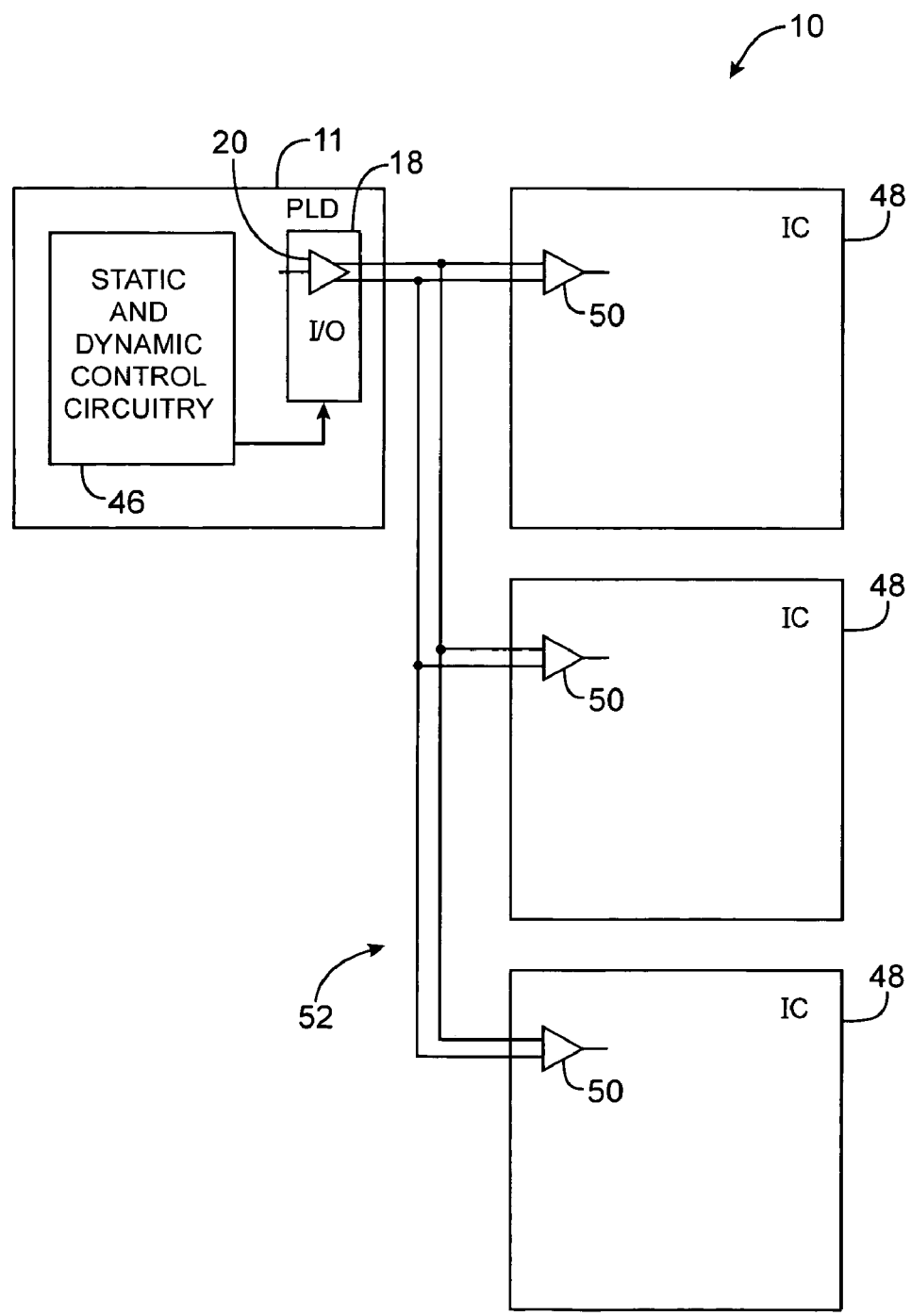
FIG. 2 is a schematic diagram showing how a programmable logic device with adjustable I/O circuitry can communicate with multiple integrated circuit devices on a multi-drop bus in accordance with the present invention

In some system configurations, programmable logic device 11 may be connected to multiple integrated circuits using a shared multi-drop bus. This type of arrangement is shown in FIG. 2. In the example of FIG. 2, programmable logic device 11 is connected to three integrated circuits 48. Each integrated circuit 48 has an input driver 50. Data signals from programmable logic device 11 may be conveyed to each integrated circuit 48 by using output driver 20 to transmit the data signals over multi-drop bus 52 to a corresponding input driver 50.

Each of the integrated circuit input drivers 50 may have different characteristics. For example, one integrated circuit input driver may function properly only at a relatively high voltages, whereas another integrated circuit input driver may function best at relatively low voltages. If desired, static and dynamic control circuitry 46 (e.g., circuitry implemented using the static programmable elements such as elements 42 of FIG. 1 and implemented using core logic 36) may be used to control input-output circuitry 18 to accommodate these diverse requirements. As an example, the output driver 20 may be automatically configured to alternately satisfy the communications requirements of two different integrated circuits 48. The output driver may be adjusted (e.g., in real time or using the static control signals) for optimum communications with either a first input driver 50 in a first integrated circuit 48 or with a second input driver 50 in a second integrated circuit 48 or may be adjusted for communications with both of these circuits.

Figure 3:
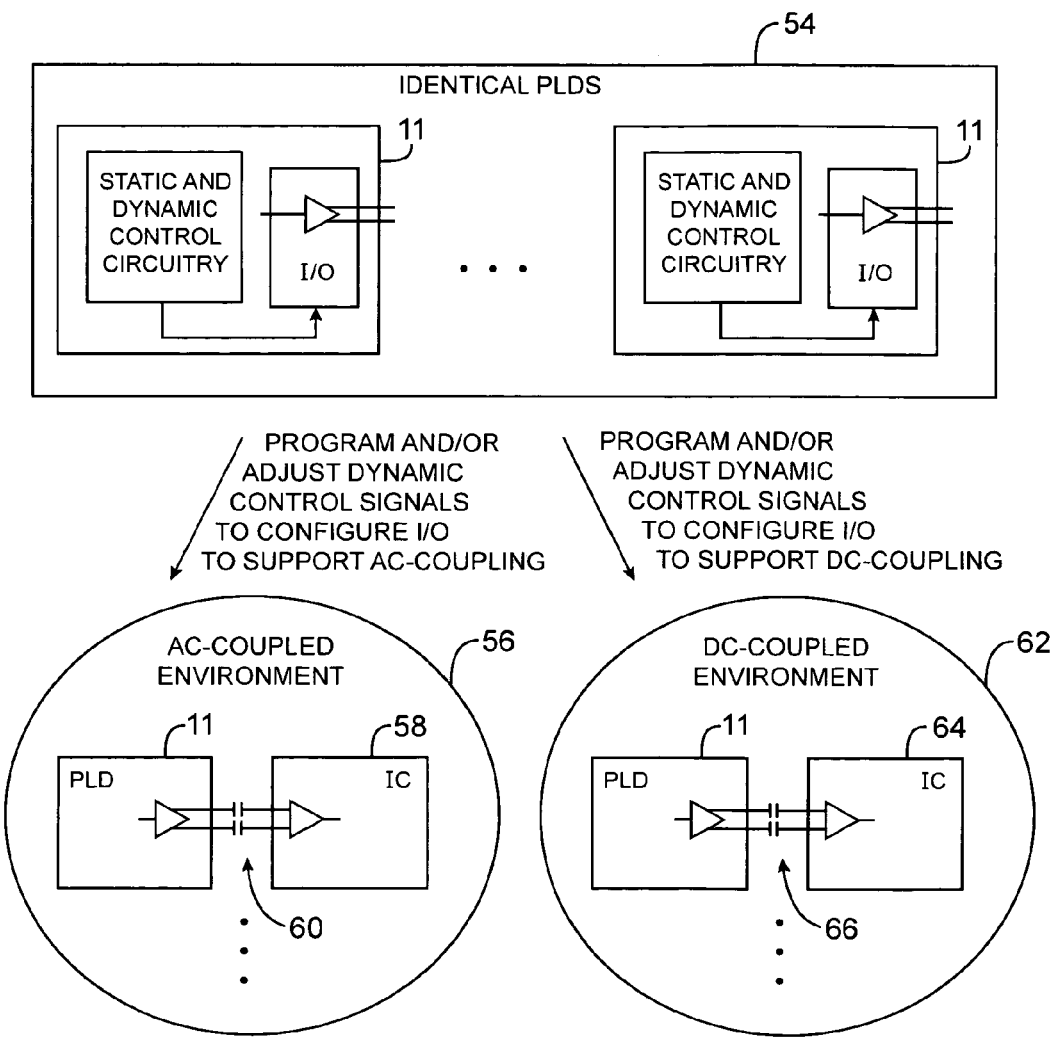
FIG. 3 is a schematic diagram showing how the same type of programmable logic device may be configured to operate in both-AC-coupled and DC-coupled system environments in accordance with the present invention.

Moreover, because the input-output circuitry 18 is adjustable, it is not necessary for each programmable logic device 11 to be configured in the same way. As shown in FIG. 3, a manufacturer can produce multiple identical programmable logic devices 54. The programmable logic devices 54 may vary in some trivial respects (e.g., they may each have different serial Nos.), but may otherwise be essentially identical. In some systems, the programmable logic devices may be placed into an AC-coupled environment 56, in which each programmable logic device communicates with an integrated circuit such as integrated circuit 58 over an AC-coupled communications link 60. In other systems, the programmable logic devices may be placed into a DC-coupled environment 62 in which each programmable logic device communicates with an integrated circuit such as integrated circuit 64 over a DC-coupled communications link 66.

When device 11 is installed in an AC-coupled link, the input-output circuitry 18 on that device (e.g., the input and output driver circuitry involved) is configured appropriately to support communications on the AC-coupled link. When device 11 is installed in a DC-coupled link, the same input-output circuitry 18 can be configured so that it supports communications on the DC-coupled link. The adjustable input-output circuitry capabilities of device 11 may therefore be used to make device 11 flexible enough to be used in diverse system environments. Being able to use the same type of programmable logic device 11 (i.e., chips with the same part number) in both AC-coupled and DC-coupled environments makes the device 11 more flexible for system designers than other programmable logic devices. Additional flexibility may be provided for device 11 to allow device 11 to be configured to reduce power consumption on its differential channels or to optimize performance on its differential channels.

To enhance flexibility and to accommodate the requirements of various different AC-coupled and DC-coupled differential communications paths, the input and output drivers of programmable logic device 11 preferably have adjustable common-mode-voltage bias circuitry.

Figure 4:
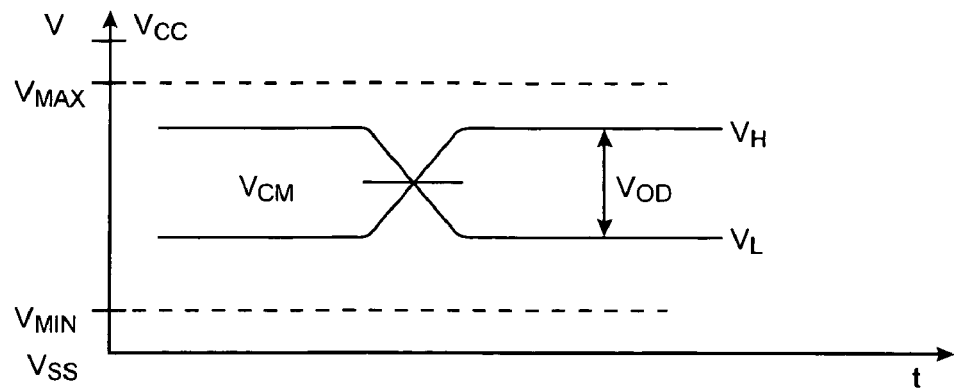
FIG. 4 is a graph showing the common mode voltage $V_{CM}$ and peak-to-peak output voltage swing associated with a differential data signal in accordance with the present invention.

As shown in FIG. 4, the common-mode voltage $V_{CM}$ (or average voltage) of a given differential data signal lies midway between the signal's maximum voltage $V_H$ and minimum voltage $V_L$.

Figure 5A:
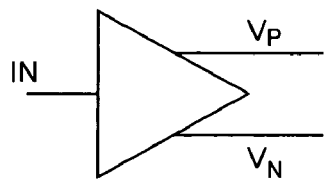
FIG. 5a is a diagram of an illustrative output driver with a single-ended data input in accordance with the present invention.
Figure 5B:
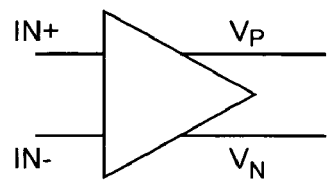
FIG. 5b is a diagram of an illustrative output driver with differential inputs in accordance with the present invention.

The differential output drivers of the input-output circuitry 18 may be driven by single-ended data inputs (FIG. 5a) or differential data inputs (FIG. 5b). For clarity, the present invention will be described primarily in the context of differential data input configurations. This is, however, merely illustrative. Either type of output driver input line configuration may be used if desired.

Figure 6:
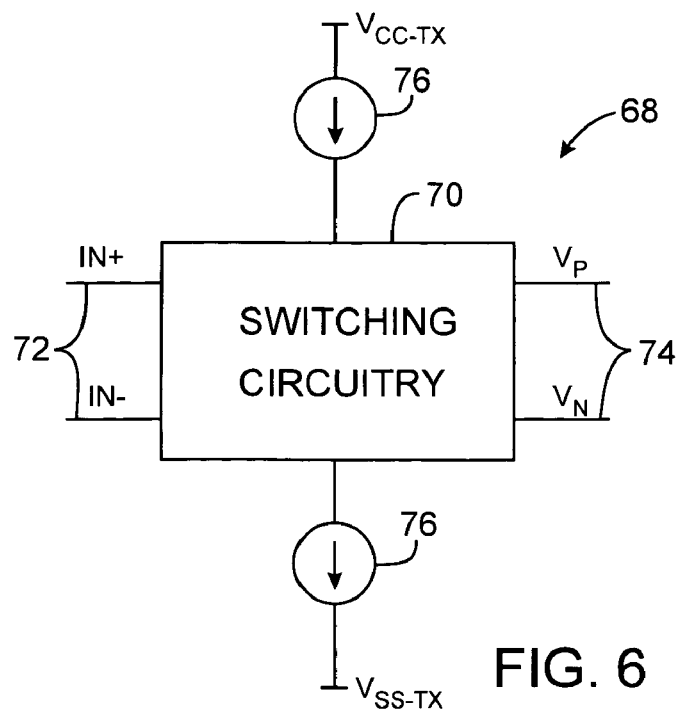
FIG. 6 is a diagram of an output driver in accordance with the present invention.

An illustrative differential output driver 68 is shown in FIG. 6. Differential output driver 68 may have switching circuitry 70 that is driven by differential data signals applied to differential input terminals 72 from core logic 36 (FIG. 1). The resulting output data appears on differential output driver output terminals 74 (labeled $V_P$ and $V_N$ in FIG. 6). In response to the input signals on terminals 72, the switching circuitry 70 steers the current from current sources 76 through resistors to produce the differential output signal across the $V_P$ and $V_N$ outputs.

The differential input drivers and output drivers of system 10 may be used to support high-speed communications. Typical data rates supported by the data channels in system 10 may be in the range of 400 Mbps to 3.2 Gbps. Current sources 76 and switching circuitry 70 typically contain metal-oxide-semiconductor transistors. To ensure adequate performance of the output driver of FIG. 6, it is necessary to maintain the transistors in current sources 76 and 76 in saturation. If the transistors in the current sources start to operate in the linear regime, the performance of the output driver will generally not be acceptable.

As shown in FIG. 6, the driver 68 may be powered using an upper power supply voltage $V_{CC-TX}$ and a ground voltage $V_{SS-TX}$. To ensure that the transistors of current sources 76 and 76 remain in saturation, care must be taken to maintain the upper and lower voltages of the data signal within certain bounds. As shown in FIG. 4, the upper voltage $V_H$ of the differential data signal should remain below a certain maximum voltage $V_{MAX}$ (typically about 0.2 to 0.3 volts below the upper power supply voltage $V_{CC}$) and the lower voltage $V_L$ should remain above a certain minimum voltage $V_{MIN}$ (typically about 0.2 to 0.3 volts above the ground voltage $V_{SS-TX}$).

For a given peak-to-peak output voltage swing ($V_{OD}$), the requirement that the maximum and minimum voltage of the differential data signal be maintained within certain limits imposes a constraint on the common-mode voltage $V_{CM}$ of the data signal. The common-mode voltage $V_{CM}$ cannot be too high, because this would cause $V_H$ to exceed $V_{MAX}$. The common-mode voltage $V_{CM}$ also cannot be too low, because this would cause $V_L$ to fall below the minimum acceptable voltage $V_{MIN}$.

Figure 7:
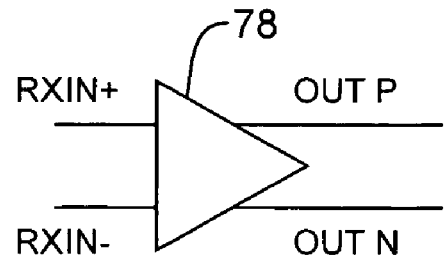
FIG. 7 is a schematic diagram of an illustrative input driver in accordance with the present invention.

Similar constraints exist for the differential input drivers in system 10. An illustrative differential input driver 78 is shown in FIG. 7. Differential input signals from a differential communications path are applied across input terminals RXIN+ and RXIN−. The input driver may convert these raw differential signals into single-ended or differential digital data signals. In the example of FIG. 7, input driver 78 converts the differential signals across inputs RXIN+ and RXIN− to digital data signals across terminals OUTP and OUTN. The OUTP and OUTN signals are usable by the digital processing circuit on the integrated circuit on which the input driver 78 is located.

Figure 8:
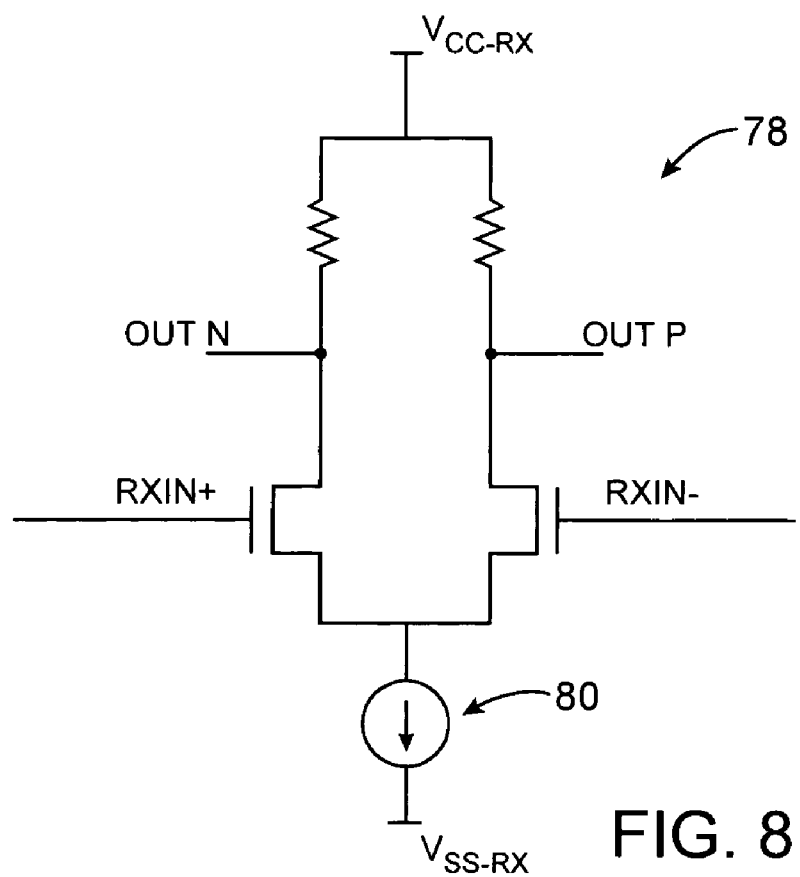
FIG. 8 is a circuit diagram of an illustrative input driver in accordance with the present invention.

As shown in FIG. 8, input driver 78 may have a current source 80. To maintain adequate performance for input driver 78, the transistors of current source 80 must be maintained in saturation (as with the current source transistors of output driver current sources 76 of FIG. 6). The need to maintain the transistors of current source 80 in saturation imposes limits on the maximum and minimum acceptable voltages for the signals received across input terminals RXIN+ and RXIN−. For a given voltage swing $V_{OD}$, these limits restrict the maximum and minimum acceptable common-mode voltage $V_{CM}$ of the data signals across RXIN+ and RXIN−.

Due to these constraints, there is a limited range of common-mode voltages that will be tolerated at the output drivers and the input drivers in system 10. Common-mode-voltage biasing circuitry in the output drivers and input drivers can be used to maintain these common-mode-voltage levels within acceptable levels.

Figure 9:
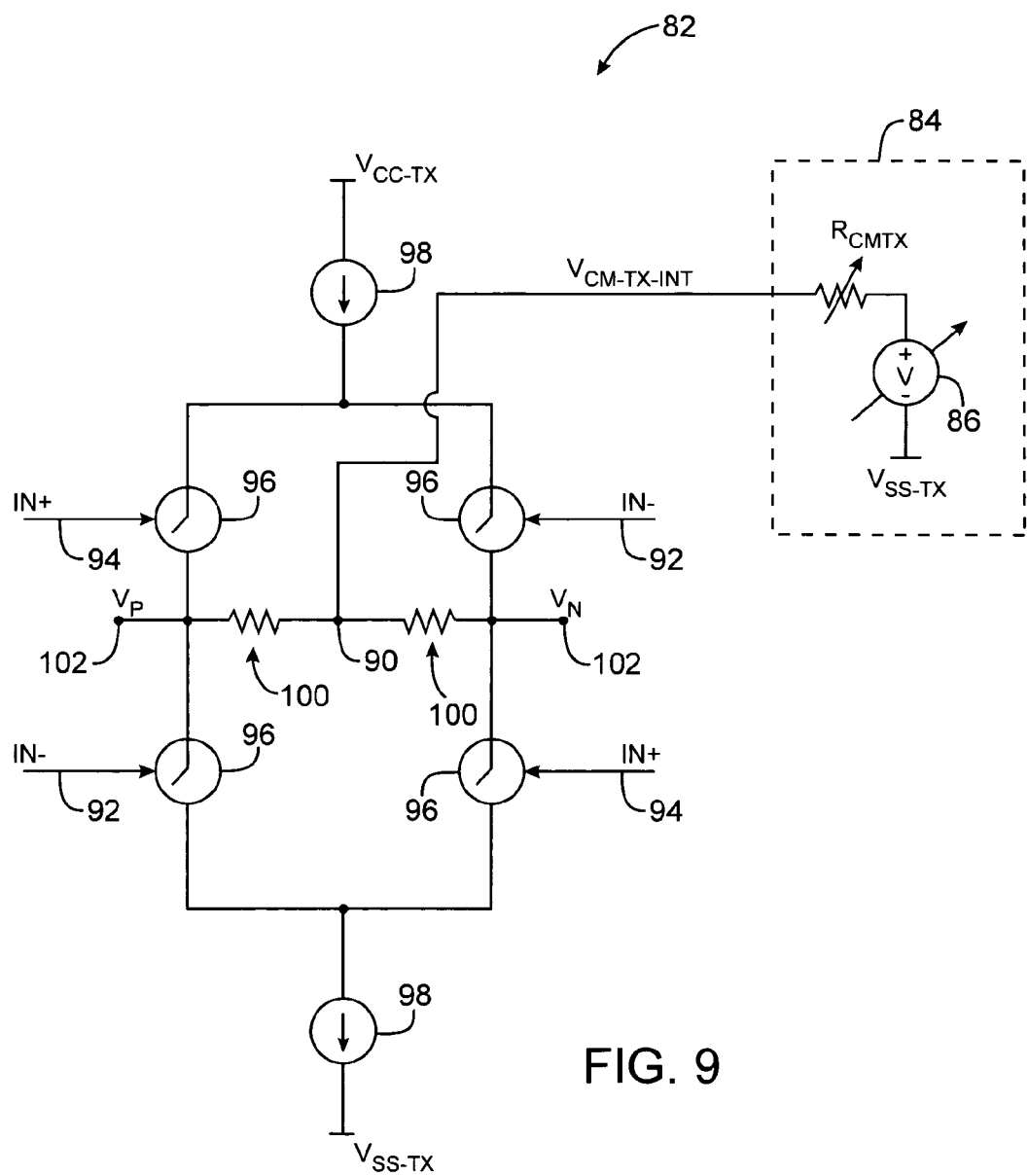
FIG. 9 is a circuit diagram of an illustrative output driver in accordance with the present invention.

An illustrative output driver arrangement with an adjustable common-mode voltage is shown in FIG. 9. Output driver 82 of FIG. 9 has common mode bias circuitry 84. The common mode bias circuitry 84 may include an adjustable voltage source 86 and an adjustable resistor 88 (labeled $R_{CMTX}$). By adjusting the resistance of resistor 88 and the voltage produced by voltage source 86, the impedance and common-mode-voltage level at node 90 ($V_{CM\text{-}TX\text{-}INT}$) can be adjusted. Outgoing data (e.g., data from core logic 36 of FIG. 1) may be applied across input terminals 92 and 94. This data turns on and off switches 96. Switches 96 may be implemented using metal-oxide-semiconductor transistors or any other suitable arrangement. As switches 96 are turned on and off, current flowing between current sources 98 is steered through resistors 100, thereby producing differential output signals at output terminals 102 (labeled $V_P$ and $V_N$).

Figure 10A:
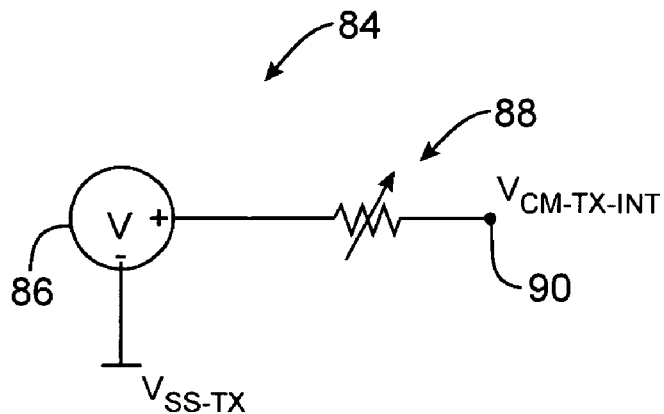
FIGS. 10a and 10b show an illustrative common-mode-voltage bias circuit that may be used with input and output drivers in accordance with the present invention.
Figure 10B:
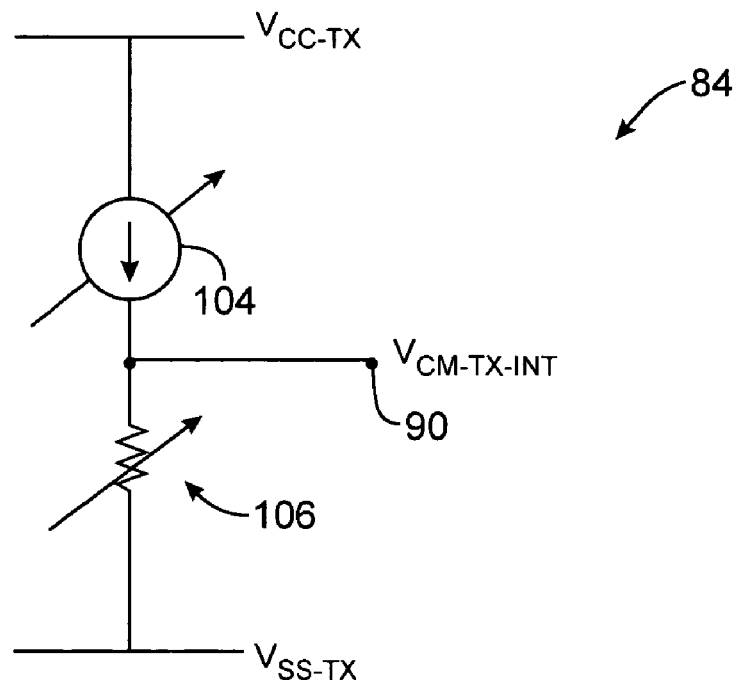

Although the common-mode biasing circuitry 84 of FIG. 9 is shown as including an adjustable resistor and adjustable voltage source, common-mode biasing circuitry 84 can also be depicted using the circuit equivalent of an adjustable resistor and an adjustable current source. These two equivalent representations for common-mode-voltage-biasing-circuitry 84 are shown in FIGS. 10a and 10b, respectively. In the representation of FIG. 10a, the common-mode voltage at node 90 of output driver 82 ($V_{CM\text{-}TX\text{-}INT}$) is adjusted by adjusting voltage source 86 and resistor 88. In the representation of FIG. 10b, the value of $V_{CM\text{-}TX\text{-}INT}$ can be set by adjusting current source 104 and resistor 106. Either of these circuit diagram representations may be used interchangeably to depict the illustrative common-mode-voltage biasing circuitry for the differential output drivers and differential input drivers of system 10.

The adjustable resistors in the common-mode-voltage biasing circuitry may be formed using any suitable adjustable resistor arrangement. One illustrative arrangement for adjustable resistors such as resistor 88 of FIG. 10a or resistor 106 of FIG. 10b is shown as resistor 108 in FIG. 11a. The resistance of resistor 108 between terminals 110 and 112 can be adjusted by selectively switching one or more of resistors 114 into the circuit using transistors 116. Transistors 116 may be turned on or off by dynamic control signals (e.g., signals received on lines 40) or by static control signals (e.g., signals from programmable elements 118 such as RAM cells). If all of the transistors are off, there is an open circuit between terminals 110 and 112. If one transistor 116 is turned on, the resistance of resistor 108 is equal to the resistance of the resistor 114 in the path that has been switched into use. If multiple transistors 116 are turned on, the resistors 114 in their respective paths operate in parallel, so that the resulting overall resistance of resistor 108 is governed by the parallel combination of the individual path resistances. The resistors 114 may all be equal or some of the resistors 114 may be of different resistance values, to provide greater range and accuracy for resistor 108. Although resistor 108 is shown as having three parallel paths, any suitable number of parallel paths may be used in resistor 108 if desired.

Figure 11A:
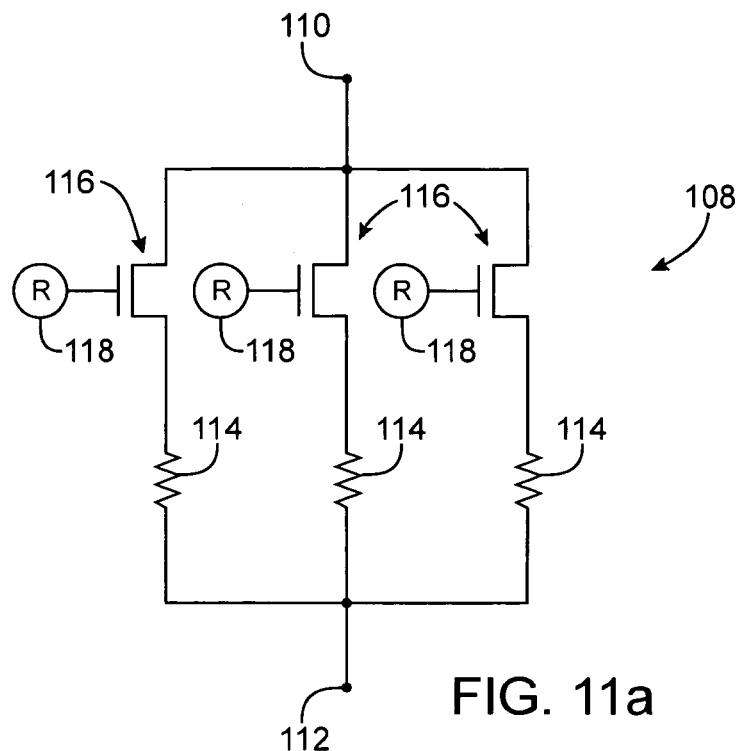
FIGS. 11a and 11b are circuit diagrams of illustrative controllable resistors in accordance with the present invention.
Figure 11B:
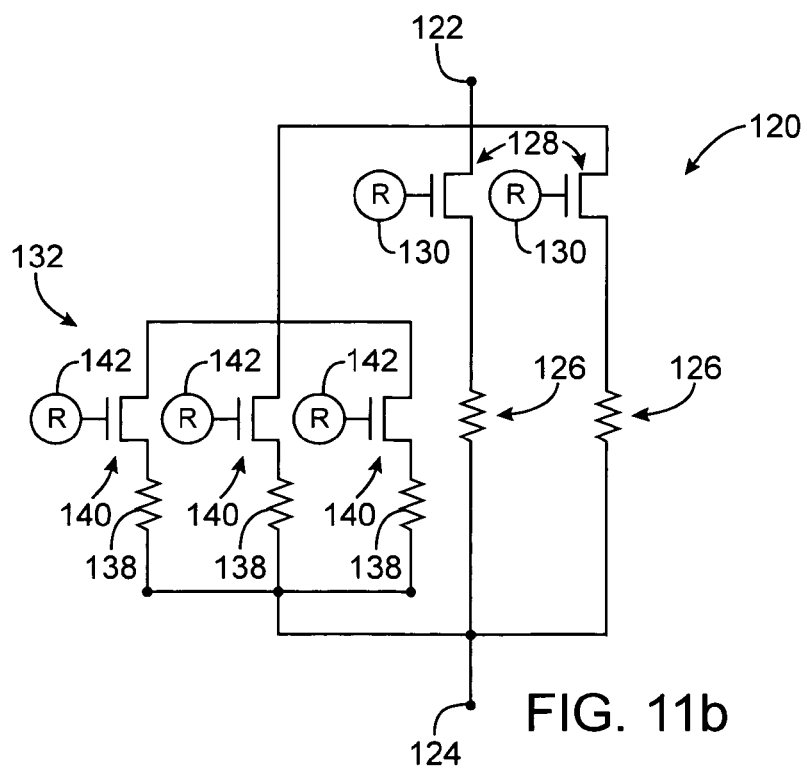

Another suitable arrangement for an adjustable bias-circuit resistor is shown in FIG. 11b. In the arrangement of FIG. 11b, resistor 120 has multiple parallel paths, each having a respective resistor 126 and a controllable switch formed from a transistor 128. The transistors 128 may be controlled by dynamic control signals or static control signals from RAM cells 130. The resistances in each path can be selectively switched into the circuit between terminals 122 and 124 by turning on their respective transistors 128.

In addition, resistor 120 may have a parallel resistance 132 formed from multiple resistors 138. These resistors may be switched into use by turning on their associated transistors 140 using dynamic control signals or static control signals from programmable elements 142. By adjusting which of the resistors 138 are used, the overall resistance of resistor 132 may be adjusted. In turn, resistor 132 is part of the larger set of parallel resistances formed by the parallel combination of resistors 126 with resistor 132. As a result, the resistance of resistor 120 can be controlled by selective control of transistors 128 and 140. Transistors 128 may be used to provide coarse adjustments to the resistance or resistor 120 and transistors 142 may be used to provide finer adjustments to the resistance of resistor 120.

The configurations of FIGS. 11a and 11b are merely illustrative. Any suitable number of parallel paths and any suitable number of paths having sub-resistors and sub-transistors such as the components of resistor 132 of FIG. 11b may be used if desired. The control signals for the control transistors in the adjustable resistor may be static control signals or dynamic control signals or both. These control signals may be applied to resistors such as resistors 108 and 120 using the static and dynamic control circuitry in programmable logic device 11.

The adjustable resistors may be used in the common-mode-voltage biasing circuitry in the input and output drivers. Adjustable resistors may also be used for resistors such as resistors 100 of FIG. 9 or the resistors in input driver 78 (FIG. 8) to adjust the output impedance (or input impedance) of the drivers to match the impedance on the differential signal lines on a given channel.

Figure 12:
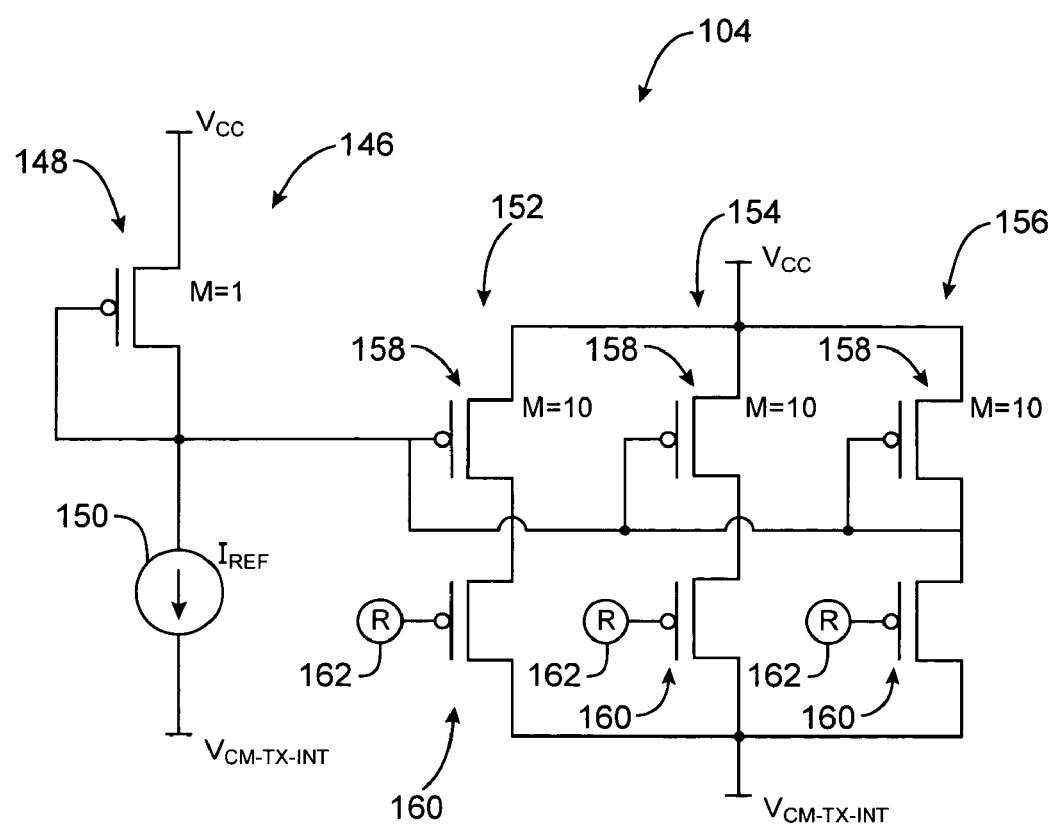
FIG. 12 is a circuit diagram of an illustrative controllable current source based on parallel current mirrors that may be used in a common-mode-voltage bias circuit for an input or output driver in accordance with the present invention

An adjustable current source that may be used for the common-mode-voltage bias circuitry in the input and output drivers (i.e., for current source 104 of FIG. 10b) is shown in FIG. 12. Current source 104 of FIG. 12 has a reference section 146 having a transistor 148 and a reference current source 150. Current source 104 uses a current mirror arrangement in which the current of the reference section is "mirrored" by the current flowing through parallel branch sections such as sections 152, 154, and 156. Each branch section has a current mirror transistor 158 and a control transistor 160. The dimensions of the transistors of source 104 may be selected so that there is a particular multiplication factor M associated with each of the current mirror sections. With this type of arrangement, the current flowing in each branch of the current mirror is a multiple of the current $I_{REF}$ that flows through the reference section 146. In the example of FIG. 12, the value of M is 10, so the current flowing through each current mirror section is 10×greater than the reference current $I_{REF}$.

Control transistors 160 may be controlled by static and dynamic control signals from static and dynamic control circuitry 46 (FIG. 2). In the illustrative arrangement of FIG. 12, each transistor 160 is turned on or off depending on the value of a programmable configuration bit stored in a respective RAM cell 162.

To adjust the current of source 104, the static and/or dynamic control signals are selected such that the desired number of current mirror sections are switched into use. The current of the current source that flows between the positive power supply voltage terminal ($V_{CC}$) and the terminal $V_{CM\text{-}TX\text{-}INT}$ (or $V_{CM\text{-}RX\text{-}INT}$ when source 104 is used in an input driver) is proportional to the number of branch sections (e.g., sections such as 152, 154, and 156) that are turned on. If desired, the multiplication factor M may be different for different branches, to provide a larger range of adjustable currents with a higher accuracy. Some of the branches may have high multiplication factors M and may be switched on or off to make coarse adjustments to the current. Other branches may have lower multiplication factors M and may be switched on or off as needed to make finer current adjustments. The multiplication factors M may be unity or less than unity if desired. Although three branch sections are shown in the illustrative adjustable current source arrangement of FIG. 12, this is merely illustrative. Current source 104 may have any suitable number of branch sections.

Using a programmable current source of the type shown in FIG. 12 and a programmable resistor of the type shown in FIG. 11a or 11b, the bias current and bias resistance of the common-mode-voltage bias circuitry (e.g., bias circuitry arranged as shown in FIG. 10b) may be adjusted independently. This allows separate adjustment of the resistance associated with the bias circuitry and the output voltage applied to the transmitter or receiver side of the link by the bias circuitry (e.g., the bias voltage $V_{CM\text{-}TX\text{-}INT}$ that is applied on the transmitter side or the bias voltage $V_{CM\text{-}RX\text{-}INT}$ that is applied on the receiver side).

Figure 13:
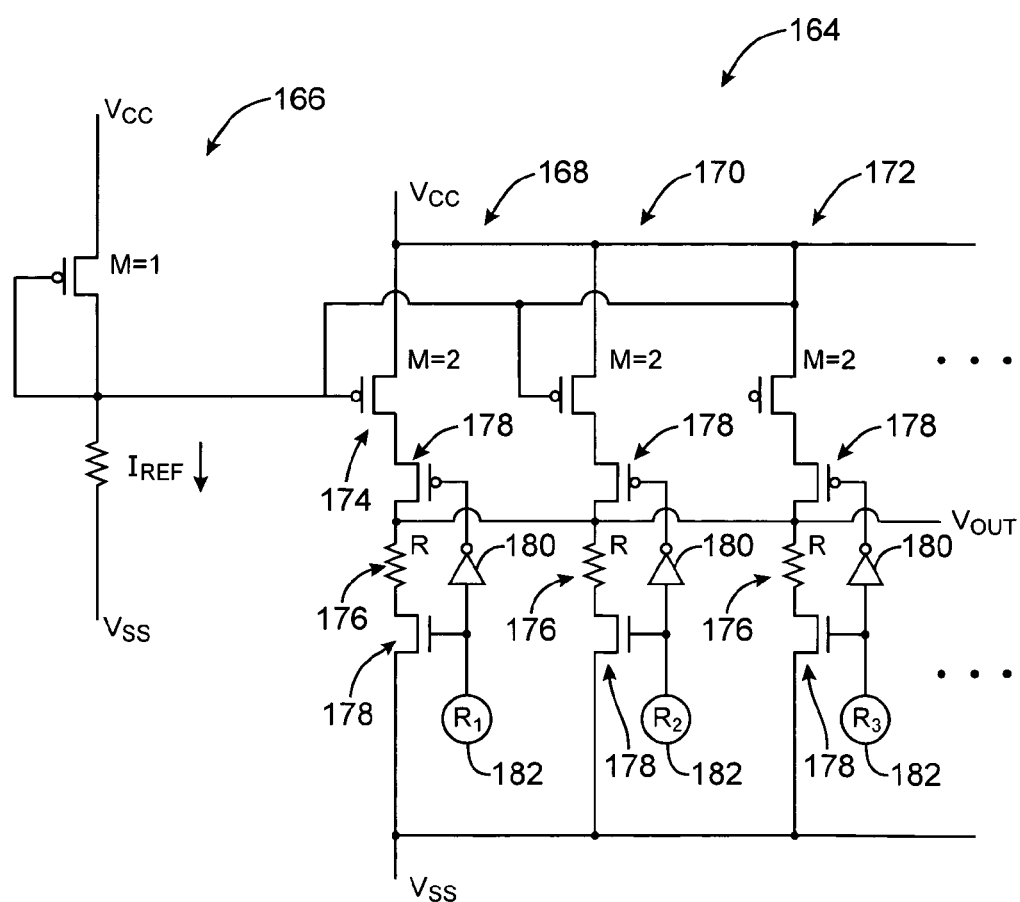
FIG. 13 is a circuit diagram of an illustrative controllable current source and controllable resistor arrangement that may be used in a common-mode-voltage bias circuit for an input or output driver in accordance with the present invention.

If desired, the resistance and the current (voltage) of the bias circuitry can be adjusted together. An illustrative adjustable common-mode-voltage bias circuit that may be used to control transmitter and receiver common-mode voltages and in which the resistance and current are adjusted together is shown in FIG. 13. Circuit 164 has a reference section 166 and associated current mirror branch sections 168, 170, and 172. There are three branch sections in the example of FIG. 13, but in general any suitable number of branch sections may be used.

Each branch section has a current mirror transistor 174. In FIG. 13, each current mirror transistor has a multiplication factor M of 2. This is merely illustrative. Different current mirror transistors may have different associated multiplication factors or all of the multiplication factors may be the same.

Each branch section has an associated resistor 176 (having a resistance R) that is connected in series with its current mirror transistor. The resistances of each resistor 176 may be the same or may differ. In the example of FIG. 13, each resistance R is the same. The branches of the bias circuit 164 may be switched into or out of the circuit using control transistors 178, inverters 180, and static and dynamic control signals from static and dynamic control circuitry 46 (FIG. 2). In the illustrative example of FIG. 13, each branch section of circuit 164 has two control transistors and a single inverter that are controlled by static control signals from an associated RAM cell 182. The inverter is used to invert the control signal so that the p-channel MOS (PMOS) control transistor 178 and the n-channel MOS (NMOS) control transistor 178 in each branch are either both turned on or are both turned off (depending on the state of the control signals applied to their gates).

As more branches are switched into the circuit of FIG. 13 (by turning the control transistors 178 in the desired branches on), the current produced by bias circuit 164 increases accordingly. The resistance of the circuit decreases in proportion, because as each branch is switched into use, the resistance R in that branch becomes connected in parallel with the other resistances R. As a result, as more branches are turned on, the current produced by the bias circuit rises and the resistance produced by the bias circuit decreases. When branches are turned off, the current produced by the bias circuit 164 decreases and the resistance rises in the same way.

Figure 14:
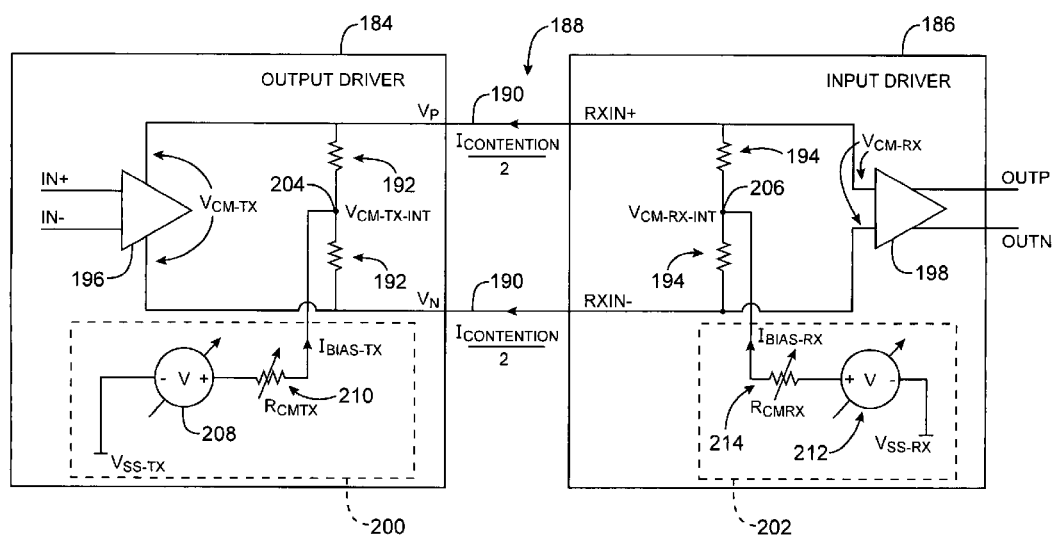
FIG. 14 is a circuit diagram of an illustrative differential signaling communications link in which common-mode-voltage biasing circuitry may be used to adjust performance parameters in accordance with the present invention.

FIG. 14 contains a diagram of a differential communications link that shows how common-mode-voltage bias circuitry is used in system 10. In the example of FIG. 14, differential output driver 184 transmits differential data signals to differential input driver 186 over a differential communications link 188 having a pair of associated signal lines 190. A DC-coupled arrangement is being used, so there are no DC-blocking capacitors in link 188. The signals lines 190 have an associated impedance. As an example, lines 90 may have a 50 ohm impedance. Resistors 192 in output driver 184 and resistors 194 in input driver 186 may have fixed or adjustable values. If desired, the resistors 192 may be configured to have infinite impedance and the associated common-mode driver circuitry may be disabled at one or both ends of a link. This may be appropriate, for example, where an external biasing network is used for termination and/or common-mode biasing at one or both ends of a link.

If the values of the termination resistances are fixed, the input and output drivers are preferably designed to communicate over 50 ohm lines (in this example). If the values of the termination resistances are adjustable, static and/or dynamic control signals may be used to disable these resistors or to select appropriate resistances for resistors 192 and 194 to match the output impedance of output driver 184 to the impedance of lines 190 and to match the input impedance of input driver 186 to the impedance of lines 190. Matching impedances in this way helps to reduce ringing and signal losses due to reflections at the interfaces between the drivers and the signal lines.

Output driver 184 may receive data to transmit to driver 186 at inputs IN+ and IN−. If output driver 184 is on a programmable logic device, these signals may be provided by core logic 36-(FIG. 1). These signals may be transmitted to input driver 186 over link 188 as signals $V_P$ and $V_N$. The voltages of the differential data signals may change during transmission from output driver 184 to input driver 186 (e.g., due to line attenuation). Accordingly, these signals are labeled as RXIN+ and RXIN− at the input to input driver 186. Input driver 186 receives the RXIN+ and RXIN− signals and converts these signals to digital data signals (OUTP and OUTN) for use by downstream circuitry.

Output driver 184 and input driver 186 are generally located on different integrated circuits. The integrated circuits may be mounted on the same circuit board or different circuit boards. When the integrated circuits are located on the same circuit board, the differential communications paths 190 are typically formed using conductive traces on the circuit board. When board-to-board communications are involved, path 188 involves on-board paths formed from conductive metal lines and board-to-board paths formed through system backplane busses, etc.

Output driver 184 and input driver 186 may both be part of programmable logic device integrated circuits. If desired, only one of these drivers may be located on a programmable logic device. The other driver may be located on a non-programmable-logic-device integrated circuit. If desired, driver 184 and driver 186 may both be located on integrated circuits other than programmable logic devices.

Output driver 184 has an output driver circuit 196 (i.e., a differential output buffer) that contains current sources such as current sources 76 of FIG. 6. The two differential outputs of driver circuit 196 are bridged by the two resistors 192, which are separated by an output driver node 204. The common-mode voltage of the differential signals produced at the output of buffer circuit 186 may be referred to as $V_{CM\text{-}TX}$. To ensure that the driver circuit 186 operates properly, the transistors in the current sources of driver circuit 186 should remain in saturation. Accordingly, the value of $V_{CM\text{-}TX}$ must be maintained within a suitable range, thereby ensuring that the maximum and the minimum voltages of the differential signals are not too high or too low, as discussed in connection with FIG. 6.

Input driver 186 has an input driver circuit 198 (i.e., a differential input buffer) with two differential inputs that are bridged by the two resistors 194. The resistors 194 are connected at input driver node 206. The current source transistors in driver 198 must be prevented from falling out of saturation, as described in connection with the operation of current source 80 of FIG. 8. As a result, the common-mode voltage $V_{CM-RX}$ of the signals received at the inputs to circuit 198 must be maintained at an acceptable level.

The constraints imposed on $V_{CM-TX}$ and $V_{CM-RX}$ (e.g., due to the use of driver circuits in which certain current source transistors must remain in saturation to function properly) may be satisfied by using common-mode-voltage bias circuitry 200 in output driver 184 and by using common-mode-voltage bias circuitry 202 in input driver 186. Circuitry 200 may be used to adjust the common-mode voltage $V_{CM-TX-INT}$ at node 204. Circuitry 202 may be used to adjust the common-mode voltage $V_{CM-RX-INT}$ at node 206.

As shown in FIG. 14, common-mode-voltage bias circuitry 200 may have an adjustable voltage source 208 and an adjustable resistor 210 (or an equivalent resistor and current source arrangement as described in connection with FIG. 10b). The bias current produced by the bias circuit 200 is labeled $I_{BIAS-TX}$. Common-mode-voltage bias circuitry 202 may have an adjustable voltage source 212 and an adjustable resistor 214. In bias circuits 200 and 202, the voltage sources and resistors can be controlled independently or together (e.g., using a simultaneous adjustment arrangement of the type shown in FIG. 13).

If the common-mode voltages of the output driver and input driver are not equal, a DC current will flow along lines 190. This DC current (called $I_{CONTENTION}$) is the result of the mismatch in the voltages $V_{CM-TX-INT}$ and $V_{CM-RX-INT}$. Large values of $I_{CONTENTION}$ can lead to undesirably large amounts of power loss in the system. Accordingly, bias circuits 200 and 202 may be adjusted to help equalize $V_{CM-TX-INT}$ and $V_{CM-RX-INT}$. This will reduce or eliminate $I_{CONTENTION}$.

Care should be taken, however, not to degrade the performance of the output driver 196 or input driver 198 by selecting a value for $V_{CM-TX-INT}$ or $V_{CM-RX-INT}$ that changes $V_{CM-TX}$ or $V_{CM-RX}$ so much that the maximum or minimum desired values of the differential signal voltage (shown as $V_H$ and $V_L$ in FIG. 4) are exceeded. The signal voltages should not be so great or so small as to make the current source transistors in the output driver 196 or input driver 198 to fall out of saturation. Accordingly, there is generally a need to balance reductions in DC power loss due to common-mode voltage mismatch and the need to achieve adequate high-speed link performance. When controlling bias circuits 200 and 202, either power loss can be minimized, performance can be maximized, or both power loss and performance can be taken in consideration and a satisfactory balance achieved between these two goals.

Because there is a bias circuit at both the output driver 184 and input driver 186, common-mode voltage adjustments can be made using only one bias circuit (i.e., only the bias circuit 200 at the transmitter or only the bias circuit 202 at the receiver). Adjustments may also be made using both bias circuits simultaneously.

Receivers are often more sensitive than transmitters to changes in common-mode voltage. Accordingly, it is often desirable to adjust the common-mode voltage at the receiver to optimize receiver performance, so long as transmitter performance remains at acceptable levels.

The table of FIG. 15 shows how the receiver common-mode voltage $V_{CM-RX}$ may be adjusted using either a resistance and voltage (current) adjustment at the receiver using bias circuit 202 or a resistance and voltage (current) adjustment at the transmitter using bias circuit 200. In the example of FIG. 15, the optimum common-mode voltage of the output driver is lower than the optimum common mode voltage of the input driver. When the output driver and input driver attempt to communicate over link 188 (FIG. 14) with these settings, the lower common-mode voltage of the output driver causes the higher common-mode voltage $V_{CM-RX}$ at the input driver to sag. This sag in the receiver's common mode voltage level can cause the current source transistors in the input driver to fall out of saturation, thereby degrading receiver performance. To alleviate this performance degradation at the input driver, the common mode voltage $V_{CM-RX}$ can be raised using the bias circuitry.

As shown in the first row of the table of FIG. 15, one way to increase the voltage $V_{CM-RX}$ is to lower the receiver bias circuit's resistance $R_{CMRX}$. Static and/or dynamic control signals from static and/or dynamic control circuitry such as static and dynamic control circuitry 46 of FIG. 2 may be applied to the receiver's bias circuit 202 to lower the resistance of variable resistor 214 (FIG. 14). The voltage of the adjustable voltage source 212 may be increased in concert with the decrease in the resistance $R_{CMRX}$. The rise in the receiver bias current-$I_{BIAS-RX}$ associated with this change is reflected in the second column of the first row of the table of FIG. 15.

During these adjustments, the transmitter resistance and bias current are not changed. The contention current $I_{CONTENTION}$ rises (see the fifth column of the first row), because the bias current $I_{BIAS-RX}$ is being increased without making any changes at the output driver. This increases DC power consumption somewhat, although link performance is improved due to an increase in $V_{CM-RX-INT}$ and the resulting rise in $V_{CM-RX}$. The common mode voltage $V_{CM-TX-INT}$ and the common-mode voltage $V_{CM-TX}$ are pulled up by the increase in $V_{CM-RX-INT}$ and $V_{CM-RX}$, but if the transmitter is less sensitive than the receiver, the transmitter's performance will still be acceptable under these conditions. The overall performance of the link 188 can be improved considerably by improving the performance of input driver 186.

As shown in the second row of the table of FIG. 15, another way to increase the voltage $V_{CM-RX}$ is to make adjustments at the output driver 184, rather than at the input driver 186. With this approach, the resistance $R_{CMTX}$ is increased. Static and/or dynamic control signals from static and/or dynamic control circuitry such as static and dynamic control circuitry 46 of FIG. 2 may be applied to the transmitter's bias circuit 200 to raise the resistance of adjustable resistor 210. The voltage of the adjustable voltage source 212 may be decreased in concert with the increase in the resistance $R_{CMTX}$. The associated drop in the transmitter bias current $I_{BIAS-TX}$ is reflected in the fourth column of the second row of the table of FIG. 15.

As these adjustments are made, the receiver resistance and bias current are not changed (in this example). The contention current $I_{CONTENTION}$ drops, as shown in the fifth column of the second row, which decreases DC power consumption. The link 188 will be somewhat more sensitive to ringing noise and common-mode drift because the resistance $R_{CMTX}$ is higher, but link performance improves due to an increase in $V_{CM-RX-INT}$ and the resulting rise in $V_{CM-RX}$ and improvement at the input driver. The transmitter common mode voltage $V_{CM-TX-INT}$ and the common-mode voltage $V_{CM-TX}$ are increased somewhat (as when adjustments where made using the receiver bias circuit), but this rise will generally be acceptable to the transmitter, particularly when the transmitter is less sensitive to common-mode voltages changes than the receiver. In this example, overall link performance is improved, because any potential decrease in transmitter performance due to the rise in $V_{CM-TX}$ is more than offset by the increase in receiver performance due to the rise in $V_{CM-RX}$.

As described in connection with the first row of the table of FIG. 15, bias circuit adjustments to the common-mode voltages in a link may be made at the input driver. The second row of the table shows how common-mode-voltage adjustments may be made at the output driver. In general, either approach may be used or both approaches may be used together, depending on the needs of the system environment in which the input and output drivers are installed.

The bias circuitry of the present invention allows a single programmable logic device containing adjustable input and output drivers to use common-mode-voltage adjustments to optimize performance of both incoming and outgoing differential communications links. The links may be made with other programmable logic devices (e.g., programmable logic devices capable of making their own common-mode voltage adjustments or programmable logic devices with fixed common-mode voltage input and output driver circuitry) or may be made with non-programmable logic devices (with or without common-mode-voltage adjustability).

The ability to adjust the common-mode voltage of the input and/or output drivers on a programmable logic device 11 in system 10 provides system designers with flexibility in meeting differential communications link performance targets and, for a given link, allows performance to be enhanced and/or power consumption to be reduced. The flexibility of the adjustable input and output drivers allows integrated circuits with these capabilities to be used in both AC-coupled and DC-coupled environments. In AC-coupled environments the common-mode-voltage of the output drivers and input drivers can be adjusted independently to optimize performance of both the output drivers and input drivers. Contention is not a concern in AC-coupled environments, so the ends of each link can be optimized without adversely affecting overall link performance. In DC-coupled links, the ability to adjust each end of the link separately allows potentially adverse consequences of contention to be minimized.

Figure 16:
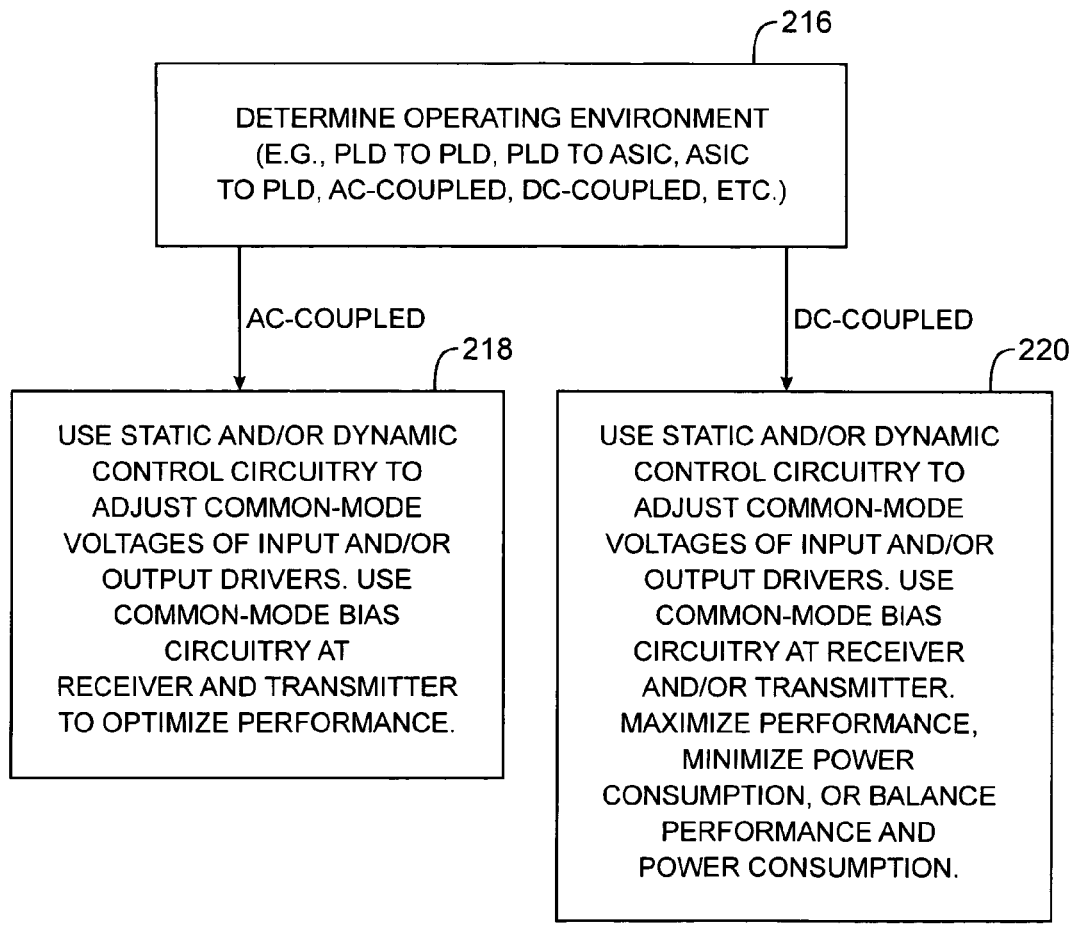
FIG. 16 is a flow chart of illustrative steps involved in using input and output drivers with adjustable bias circuitry to support AC-coupled and DC-coupled communications and to make receiver-side and transmitter-side common-mode-voltage adjustments in accordance with the present invention.

Illustrative steps involved in using integrated circuits having adjustable common-mode-voltage bias circuitry in system 10 are shown in FIG. 16. At step 216, the operating environment in which the differential communications link is to be used is determined. The operating environment may use AC-coupled or DC-coupled links. Programmable logic devices may be coupled to other programmable logic devices or to non-programmable-logic-device integrated circuits. Non-programmable-logic-device integrated circuits can be coupled to other non-programmable-logic-device integrated circuits. Because integrated circuits containing input and/or output drivers with adjustable common-mode-bias circuitry can operate in both AC-coupled and DC-coupled environments, a system designer can use the same type of part to support communications over both types of link.

If it is determined that AC-coupled links are to be used, the common-mode-voltage bias circuitry in the input and/or output drivers can be adjusted accordingly at step 218. In AC-coupled links, a DC-blocking capacitor isolates the transmitter and receiver. As a result, the common-mode-voltages at the output drivers (e.g., $V_{CM-TX}$) can be adjusted to optimize the performance of the output drivers without considering potential negative impacts on the input drivers. Similarly, the common-mode-voltages at the input drivers (e.g., $V_{CM-RX}$) can be adjusted to optimize the performance of the input drivers without considering potential negative impacts on the output drivers. The adjustments to the input and output driver common-mode voltages may be made by programming programmable elements (configuration RAM, fuses, antifuses, EPROM bits, etc.) to produce appropriate static control signals or by using dynamic control circuitry in the integrated circuits to produce appropriate dynamic control signals. Once configured by such static and dynamic control circuitry 46 (FIG. 2), the input and output drivers may be used to support differential communications in system 10.

If it is determined at step 216 that DC-coupled links are to be used, the static and dynamic control circuitry 46 (FIG. 2) can be used to adjust the input and output drivers to support these links at step 220. Because of the adjustable nature of the common-mode-voltage bias circuitry, the same type of programmable logic device (or other integrated circuit) can be configured to support both AC-coupled links (step 218) and DC-coupled links (220).

The input and output drivers in DC-coupled links are not isolated by DC-blocking capacitors. Accordingly, the input and output driver common-mode-voltage bias circuits tend to contend with each other. As described in connection with FIGS. 14 and 15, the resistance and bias current (voltage) at the input driver and output driver can be adjusted to ensure that performance is not overly compromised at either the transmitter or the receiver due to contention. The bias circuitry associated with a link can be adjusted only at the output driver, only at the input driver, or at both the output driver and input driver. Performance can be maximized (e.g., at the expense of power consumption) or power consumption can be reduced. If desired, a balance may be achieved between enhanced performance and reduced power consumption. In some situations, power consumption may be reduced while improving performance.

Adjustments may be made by adjusting the adjustable resistors and current sources (voltage sources) in the common-mode-bias circuitry using static and/or dynamic control signals from static and dynamic control circuitry 46 (FIG. 2). If desired, devices such as programmable logic device 11 may be provided with input-output circuitry 18 having both adjustable input drivers and adjustable output drivers. With this type of arrangement, the input-output circuitry can be configured to support both AC-coupled and DC-coupled communications at the same time and may be used in mixed AC-coupled/DC-coupled environments.

The foregoing is merely illustrative of the principles of this invention and various modifications can be made by those skilled in the art without departing from the scope and spirit of the invention.

What is claimed is:

1. A method of using an integrated circuit to support communications over a differential communications link, wherein the integrated circuit includes input-output circuitry with differential input drivers and differential output drivers and programmable core logic and wherein the input-output circuitry includes input driver common-mode-voltage bias circuitry and output driver common-mode-voltage bias circuitry, the method comprising:

using the programmable core logic to produce data signals for the input-output circuitry and to receive data signals from the input-output circuitry;

using the input driver common-mode-voltage bias circuitry in the input-output circuitry to adjust common-mode-voltage levels at the input drivers; and using the output driver common-mode-voltage bias circuitry in the input-output circuitry to adjust common-mode-voltage levels at the output drivers.

2. The method defined in claim 1 wherein at least a given one of the input drivers has a differential input driver circuit with two differential inputs, wherein the two differential inputs are bridged by two resistors that are separated by an input driver node, and wherein the input driver common-mode-voltage bias circuitry is connected to the input driver node, the method further comprising using the input driver common-mode-voltage bias circuitry to adjust the common-mode-voltage levels at the input driver node.

3. The method defined in claim 1 wherein at least one of the input drivers has a differential input driver circuit with two differential inputs, wherein the two differential inputs are bridged by two resistors that are separated by an input driver node, wherein the input driver common-mode-voltage bias circuitry is coupled to the input driver node, and wherein the input driver common-mode-voltage bias circuitry includes an adjustable resistor connected to the input driver node, the method further comprising using the adjustable resistor connected to the input driver node to adjust the common-mode voltage levels at the input driver node.

4. The method defined in claim 1 wherein at least a given one of the input drivers has a differential input driver circuit with two differential inputs, wherein the two differential inputs are bridged by two resistors that are separated by an input driver node, wherein the input driver common-mode-voltage bias circuitry is coupled to the input driver node, wherein the input driver common-mode-voltage bias circuitry includes an adjustable resistor, and wherein the adjustable resistor is connected to the input driver node, the method further comprising:

generating dynamic control signals on the integrated circuit that control the adjustable resistor.

5. The method defined in claim 1 wherein at least a given one of the input drivers has a differential input driver circuit with two differential inputs, wherein the two differential inputs are bridged by two resistors that are separated by an input driver node, wherein the input driver common-mode-voltage bias circuitry is coupled to the input driver node, wherein the input driver common-mode-voltage bias circuitry includes an adjustable resistor, and wherein the adjustable resistor is connected to the input driver node, the method further comprising using programmable elements on the integrated circuit to generate static control signals that control the adjustable resistor.

6. The method defined in claim 1 wherein at least a given one of the input drivers has a differential input driver circuit with two differential inputs, wherein the two differential inputs are bridged by two resistors that are separated by an input driver node, wherein the input driver common-mode-voltage bias circuitry is coupled to the input driver node, wherein the input driver common-mode-voltage bias circuitry includes an adjustable resistor, and wherein the adjustable resistor is connected to the input driver node, the method further comprising using programmable random-access-memory cells on the integrated circuit to generate static control signals that control the adjustable resistor.

7. The method defined in claim 1 wherein at least a given one of the input drivers has a differential input driver circuit with two differential inputs, wherein the two differential inputs are bridged by two resistors that are separated by an input driver node, wherein the input driver common-mode-voltage bias circuitry is coupled to the input driver node, wherein the input driver common-mode-voltage bias circuitry includes an adjustable resistor and an adjustable current source, wherein the adjustable resistor and adjustable current source are connected to the input driver node, the method further comprising:

using the adjustable current source to adjust the common-mode-voltage level at the input driver node; and using the adjustable resistor to make impedance adjustments at the input driver node.

8. The method defined in claim 1 wherein at least a given one of the output drivers has a differential output driver circuit with two differential outputs, wherein the two differential outputs are bridged by two resistors that are separated by an output driver node, and wherein the output driver common-mode-voltage bias circuitry is connected to the output driver node, the method further comprising using the output driver common-mode-voltage bias circuitry to adjust the common-mode-voltage levels at the output driver node.

9. The method defined in claim 1 wherein at least a given one of the input drivers has a differential input driver circuit with two differential inputs, wherein the two differential inputs are bridged by two input driver resistors that are separated by an input driver node, wherein the input driver common-mode-voltage bias circuitry is connected to the input driver node, wherein at least a given one of the output drivers has a differential output driver circuit with two differential outputs, wherein the two differential outputs are bridged by two output driver resistors that are separated by an output driver node, and wherein the output driver common-mode-voltage bias circuitry is connected to the output driver node, the method further comprising:

using the input driver common-mode-voltage bias circuitry to adjust the common-mode-voltage levels at the input driver node; and using the output driver common-mode-voltage bias circuitry to adjust the common-mode-voltage levels at the output driver node.

10. The method defined in claim 1 wherein at least a given one of the output drivers has a differential output driver circuit with two differential outputs, wherein the two differential outputs are bridged by two resistors that are separated by an output driver node, wherein the output driver common-mode-voltage bias circuitry is coupled to the output driver node, wherein the output driver common-mode-voltage bias circuitry includes an adjustable resistor, and wherein the adjustable resistor is connected to the output driver node, the method further comprising using the adjustable resistor to adjust the common-mode-voltage levels at the output driver node.

11. The method defined in claim 1 wherein at least a given one of the output drivers has a differential output driver circuit with two differential outputs, wherein the two differential outputs are bridged by two resistors that are separated by an output driver node, wherein the output driver common-mode-voltage bias circuitry is coupled to the output driver node, and wherein the output driver common-mode-voltage bias circuitry includes an adjustable resistor, the method further comprising generating static and dynamic control signals on the integrated circuit that control the adjustable resistor.

12. The method defined in claim 1 wherein the input driver common-mode-voltage bias circuitry and the output driver common-mode-voltage bias circuitry each include a plurality of current mirror transistors arranged in plurality of current mirror branch sections, the method further comprising:

adjusting the common-mode-voltage levels by controlling the current mirror branch sections.

13. The method defined in claim 1 wherein at least a given one of the input drivers has a differential input driver circuit-with-two differential inputs, wherein the two differential inputs are bridged by two input driver resistors that are separated by an input driver node, wherein the input driver common-mode-voltage bias circuitry is coupled to the input driver node, wherein the input driver common-mode-voltage bias circuitry includes an adjustable input driver common-mode-voltage bias circuit resistor and an adjustable input driver common-mode-voltage bias circuit current source, wherein the adjustable input driver common-mode-voltage bias circuit resistor and adjustable input driver common-mode-voltage bias circuit current source are connected to the input driver node, wherein at least a given one of the output drivers has a differential output driver circuit with two differential outputs, wherein the two differential outputs are bridged by two output driver resistors that are separated by an output driver node, wherein the output driver common-mode-voltage bias circuitry is coupled to the output driver node, wherein the output driver common-mode-voltage bias circuitry includes an adjustable output driver common-mode-voltage bias circuit resistor and an adjustable output driver common-mode-voltage bias circuit current source, and wherein the adjustable output driver common-mode-voltage bias circuit resistor and output driver common-mode-voltage bias circuit adjustable current source are connected to the output driver node, the method further comprising:

separately adjusting the output driver common-mode-voltage bias circuitry and input driver common-mode-voltage bias circuitry to make adjustments in common-mode-voltages at the input and output driver nodes.

14. An integrated circuit differential driver circuit on an integrated circuit that communicates with another integrated circuit using a differential communications path over which differential data signals are conveyed, comprising:

a differential driver that is connected to the differential communications path and through which the differential data signals are passed, wherein the differential driver has a desired common-mode-voltage operating range; and adjustable common-mode-voltage bias circuitry coupled to the differential driver that is adjusted so that the differential data signals passing through the differential driver have a common-mode voltage level within the desired common-mode-voltage operating range, wherein the common-mode-voltage bias circuitry includes an adjustable resistor and an adjustable current source that are controlled by static control signals provided on the integrated circuit.

15. The integrated circuit differential driver circuit defined in claim 14 wherein the differential driver comprise an input driver having two differential inputs and having two resistors that bridge the two differential inputs, wherein the two resistors are separated by a node to which the adjustable common-mode-voltage bias circuitry is connected.

16. The integrated circuit differential driver circuit defined in claim 14 wherein the differential driver comprise an output driver having two differential outputs and having two resistors that bridge the two differential outputs, wherein the two resistors are separated by a node to which the adjustable common-mode-voltage bias circuitry is connected.

17. The integrated circuit differential driver circuit defined in claim 14 wherein the adjustable resistor and adjustable current source each include transistors that are independently adjustable by the static control signals, so that the adjustable resistor is adjustable to produce a resistance value independent of what level of current is produced by the adjustable current source.

18. The integrated circuit differential driver circuit defined in claim 14 wherein the adjustable resistor produces an adjustable resistance, wherein the adjustable current source produces an adjustable bias current, and wherein the adjustable current source and adjustable resistor are controlled by the same static control signals so that the adjustable resistance cannot be adjusted independently from the adjustable bias current.

19. The integrated circuit differential driver circuit defined in claim 14 wherein the adjustable resistor produces an adjustable resistance, wherein the adjustable current source produces an adjustable bias current, and wherein the adjustable current source and adjustable resistor comprise a plurality of current mirror branch sections each having an associated resistor and each having at least one transistor controlled by a respective one of the static control signals, wherein the static control signals turn the transistors on and off to simultaneously adjust the adjustable resistance and the adjustable bias current.

20. An integrated circuit that is configurable to operate in either an AC-coupled differential communications environment or a DC-coupled differential communications environment, comprising:

a differential driver that is used to communicate over a differential communications link with another integrated circuit; and common-mode-voltage bias circuitry that makes common-mode-voltage adjustments at the differential driver, wherein if the integrated circuit is used in an AC-coupled environment in which the differential communications link has DC-blocking capacitors, the integrated circuit is configured to operate in the AC-coupled environment by using the common-mode-voltage bias circuitry to make common-mode-voltage adjustments at the differential driver that optimize the performance of that differential driver without regard to what common-mode voltage is desired by the other integrated circuit, and if the integrated circuit is used in a DC-coupled environment in which the differential communications link has no DC-blocking capacitors, the integrated circuit is configured to operate in the DC-coupled environment by using the common-mode-voltage bias circuitry to make common-mode-voltage adjustments at the differential driver while taking into account which common-mode-voltage changes result at the other integrated circuit.

* * * * *